(12) United States Patent  
Lin

(10) Patent No.: US 6,946,698 B1  
(45) Date of Patent: Sep. 20, 2005

(54) MRAM DEVICE HAVING LOW-K INTER-METAL DIELECTRIC

(75) Inventor: Chun-Chien Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/816,730

(22) Filed: Apr. 2, 2004

(51) Int. Cl.[7] .............................................. H01L 29/76
(52) U.S. Cl. ...................... 257/295; 257/298; 257/303; 257/306; 257/324; 438/3; 438/240
(58) Field of Search .................... 257/68, 71, 295–314, 257/324–326, 659; 438/3, 240

(56) References Cited

U.S. PATENT DOCUMENTS

| | | | |
|---|---|---|---|
| 5,956,267 A | 9/1999 | Hurst et al. | |
| 6,005,800 A | 12/1999 | Koch et al. | |
| 6,114,719 A | 9/2000 | Dill et al. | |
| 6,335,890 B1 | 1/2002 | Reohr et al. | |
| 6,368,878 B1 | 4/2002 | Abraham et al. | |
| 6,417,561 B1 | 7/2002 | Tuttle | |
| 6,430,084 B1 | 8/2002 | Rizzo et al. | |
| 6,475,812 B2 | 11/2002 | Nickel et al. | |
| 6,490,217 B1 | 12/2002 | DeBrosse et al. | |
| 6,509,621 B2 | 1/2003 | Nakao | |
| 6,515,897 B1 | 2/2003 | Monsma et al. | |
| 6,522,579 B2 | 2/2003 | Hoenigschmid | |
| 6,525,957 B1 | 2/2003 | Goronkin et al. | |
| 6,555,858 B1 | 4/2003 | Jones et al. | |
| 6,567,299 B2 | 5/2003 | Kunikiyo et al. | |
| 6,590,803 B2 | 7/2003 | Saito et al. | |
| 6,594,191 B2 | 7/2003 | Lammers et al. | |
| 6,621,731 B2 | 9/2003 | Bessho et al. | |
| 6,661,689 B2 | 12/2003 | Asao et al. | |
| 6,667,899 B1 | 12/2003 | Subramanian et al. | |
| 6,693,822 B2 | 2/2004 | Ito | |
| 6,693,826 B1 | 2/2004 | Black, Jr. et al. | |
| 6,815,783 B2 * | 11/2004 | Kim et al. | 257/421 |
| 2002/0105827 A1 | 8/2002 | Redon et al. | |
| 2003/0048676 A1 | 3/2003 | Daughton et al. | |
| 2003/0086313 A1 | 5/2003 | Asao | |

OTHER PUBLICATIONS

Saito, Yoshiaki, et al., "Correlation Between Barrier Width, Barrier Height, and DC Bias Voltage Dependencies on the Magnetoresistance Ratio in Ir-Mn Exchange Biased Single and Double Tunnel Junctions", The Japan Society of Applied Physics, vol. 39, 2000, pp. L1035-L1038.

Montaigne, F., et al., "Enhanced Tunnel Magnetoresistance at High Bias Voltage in Double-Barrier Planar Junctions", Applied Physics Letters, vol. 73, No. 19, Nov. 9, 1998, pp. 2829-2831.

Anguelouch, A., "Two-Dimensional Magnetic Switching of Micron-Size Films in Magnetic Tunnel Junctions", Applied Physics Letters, vol. 76, No. 5, Jan. 31, 2000, pp. 622-624.

* cited by examiner

Primary Examiner—Andy Huynh
(74) Attorney, Agent, or Firm—Haynes and Boone, LLP

(57) ABSTRACT

A magnetic random access memory (MRAM) device including a magnetic tunneling junction (MTJ) stack separated from one or more proximate conductive layers and/or one or more proximate MTJ stacks by a low-k dielectric material.

10 Claims, 4 Drawing Sheets

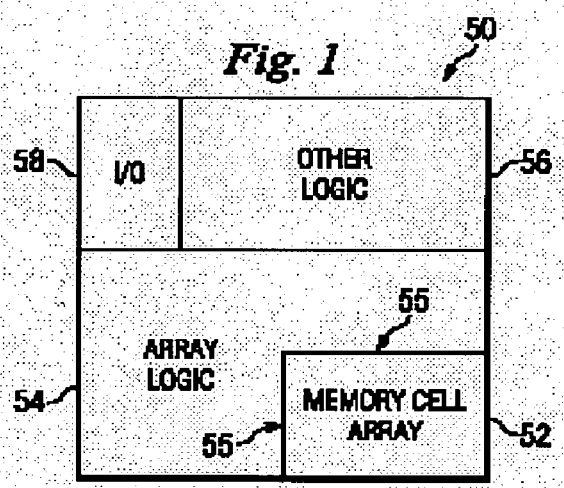
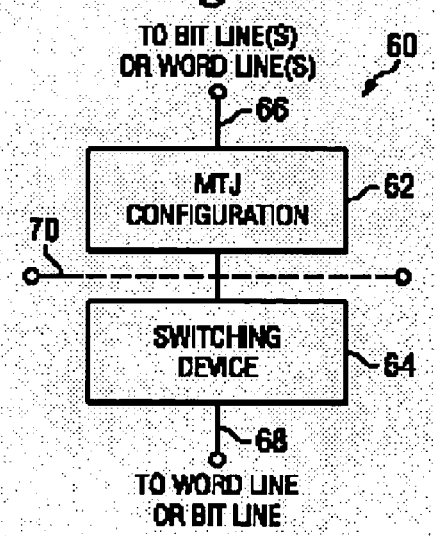

MRAM DEVICE HAVING LOW-K INTER-METAL DIELECTRIC

BACKGROUND

The present disclosure relates generally to magnetic random access memory (MRAM) devices and, more specifically, to an MRAM device having a low-k dielectric material.

MRAM devices often include an inter-metal dielectric (IMD) layer interposing an MTJ cell or stack and a bit line, word line, program line, or other conductive layer. However, the electrical characteristics of the material employed in the IMD layer can detrimentally affect performance of such MRAM devices. For example, high permittivity of the IMD layer can increase RC delay of the MRAM devices during read/write operations. Undesirable electrical characteristics of the IMD layers can also undesirably cause fault signal detection during multiple-byte read operations.

One attempt at solving such problems has been to increase the thickness of the IMD layer, at least in the region interposing the MTJ stack and a proximate bit line, program line, and/or word line. However, such an increase expands the overall size of the MRAM device and, consequently, the chip and end-use apparatus incorporating such MRAM devices. Moreover, those skilled in the art will recognize that an increase in physical size of MRAM devices and circuit, chips, etc. incorporating the devices will be accompanied by a corresponding increase in cost per chip. Furthermore, chip reliability is often inversely proportional to chip size, such that MRAM devices incorporating thicker IMD layers can exhibit excessive failure rates.

Accordingly, what is needed in the art is a memory device that addresses the above discussed issues, a method of manufacture thereof, and a system including the same.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 illustrates a block diagram of one embodiment of an integrated circuit constructed according to aspects of the present disclosure.

FIG. 2 illustrates a block diagram of one embodiment of an MRAM cell constructed according to aspects of the present disclosure.

DETAILED DESCRIPTION

Figure 3:
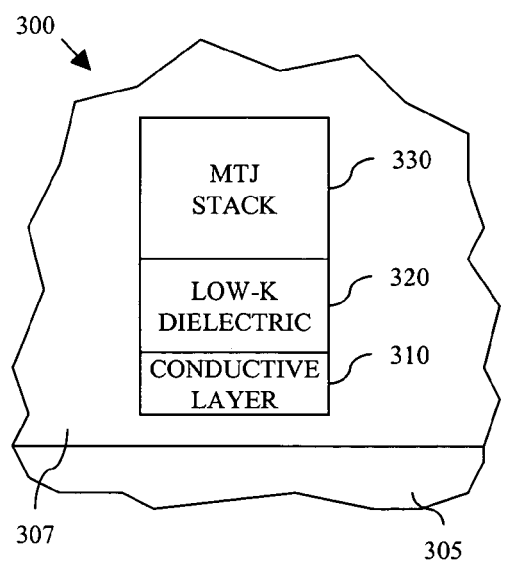
FIG. 3 illustrates a sectional view of one embodiment of an MRAM device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a block diagram of one embodiment of an integrated circuit 50 that is one example of a circuit that can benefit from aspects of the present disclosure. The integrated circuit 50 includes a memory cell array 52 that can be controlled by an array logic 54 through an interface 55. The memory cell array 52 may comprise an array of magnetic random access memory (MRAM) devices, embodiments of which are described below. It is well known in the art that various logic circuitry, such as row and column decoders and sense amplifiers, can be included in the array logic 54, and that the interface 55 may include one or more bit lines, gate lines, digit lines, control lines, word lines, and/or other communication paths to interconnect the memory cell array 52 with the array logic 54. These communication paths may hereinafter be referred to as bit lines or word lines, it being understood that different applications of the present disclosure may use different communication paths. The integrated circuit can further include other logic 56 such as counters, clock circuits, and processing circuits, and input/output circuitry 58 such as buffers and drivers.

Referring to FIG. 2, one embodiment of the memory cell array 52 of FIG. 1 may include one or more MRAM devices or cells 60. Each MRAM cell 60 does not need to be commonly configured, but for the sake of example, can be generically described as including a configuration of MTJ devices 62 and a switching device 64. Examples of various embodiments of the MTJ devices 62 are discussed in further detail below, and examples of the switching device 64 include a metal oxide semiconductor (MOS) transistor, an MOS diode, and/or a bipolar transistor. The memory cell 60 can store 1, 2, 3, 4 or more bits, but for the sake of further example, a two bit configuration will be discussed. Also, the present disclosure is applicable and/or readily adaptable to single and double junction MTJ devices with different MR ratios, where there can be four magneto-resistance levels. The different MR ratios may facilitate the capability of sensing at least four levels of magneto-resistance, and the capacity to store at least two bits.

The MRAM cell 60 may include a first terminal 66, a second terminal 68, and a third terminal 70. For the sake of example, the first terminal 66 may be connected to one or more bit lines and produce an output voltage in a read operation, which is provided to the bit line(s). The second terminal 68 may be connected to one or more word lines, which can activate the cell 60 for a read or write operation. The third terminal 70 may be proximate a control line, such as a gate or digit line, and can provide a current for producing a magnetic field to effect the MTJ configuration 62. It is understood that the arrangement of bit lines, word lines, control lines, and other communication signals can vary for different circuit designs, and the present discussion is only exemplary of such an arrangement.

Referring to FIG. 3, illustrated is a sectional view of one embodiment of an MRAM device 300 constructed according aspects of the present disclosure. The MRAM device 300 includes a conductive layer 310 located over a substrate 305, possibly separated from the susbtrate 305 by a dielectric material 307. The MRAM device 300 also includes a low-k dielectric layer 320 located over the conductive layer 310, and an MTJ stack 330 located over the low-k dielectric layer 320. Although not illustrated, additional features or layers may interpose the low-k dielectric layer 320 and the MTJ stack 330, and/or interpose the low-k dielectric layer 320 and the conductive layer 310.

The susbtrate 305 may be or comprise a silicon-on-insulator (SOI) substrate, a polymer-on-silicon substrate, silicon, gallium arsenide, gallium nitride, strained silicon, silicon germanium, silicon carbide, carbide, diamond, and/or other materials. In one embodiment, the substrate 305 comprises a fully depleted SOI substrate wherein an active device silicon layer thickness may range between about 200 nm and about 500 nm. The substrate 305 may also include an air gap providing insulation for the MRAM device 300. For example, the substrate 305 may be or comprise a "silicon-on-nothing" (SON) substrate including a thin insulation layer comprising air and/or another gaseous composition.

The dielectric material 307 may comprise silicon dioxide, Black Diamond® (a product of Applied Materials of Santa Clara, Calif.), and/or other materials, and may be formed by chemical vapor deposition (CVD), plasma enhanced CVD (PECVD), atomic layer deposition (ALD), physical vapor deposition (PVD), spin-on coating, and/or other processes. The thickness of the dielectric layer 307 may range between about 2000 angstroms and about 15,000 angstroms. In one embodiment, the portion of the dielectric layer 307 interposing the conductive layer 310 and the substrate 305 may have a thickness ranging between about 200 angstroms and about 2000 angstroms. The dielectric layer 307 may also comprise a plurality of dielectric layers.

The conductive layer 310 may be or comprise a bit line, a gate line, a digit line, a control line, a word line, and/or other communication paths possibly employed to interconnect the MRAM device 300 with other components, including other MRAM devices (such as in a memory cell array), array logic, and/or other components. The conductive layer 310 may comprise copper, aluminum, gold, silver, tungsten, alloys/compounds thereof, and/or other conductive materials, and may be formed by CVD, PECVD, ALD, PVD, electro-chemical deposition, molecular manipulation, and/or other processes, possibly to a thickness ranging between about 200 angstroms and about 2000 angstroms. The conductive layer 310 may also comprise a plurality of layers. For example, the conductive layer 310 may comprise a barrier layer or other layers possibly comprising titanium, tantalum, titanium nitride, tantalum nitride, tungsten nitride, silicon carbide, other refractory metals, and/or other materials.

The low-k dielectric layer 320 may comprise fluoride-doped silicate glass (FSG), Black Diamond®, xerogel, aerogel, amorphous fluorinated carbon, parylene, benzocyclobutenes or bis-benzocyclobutenes (collectively referred to herein as BCB), SiLK (a product of Dow Chemical of Midland, Mich.), and/or materials having a dielectric constant of about 3.9 or less. In one embodiment, the low-k dielectric layer 320 comprises a material having a dielectric constant of 2.8 or less, such as poly(arylenes), cyclotenes, parylene, poly(norbornenes), polyimide nanofoams, and/or other materials. The low-k dielectric layer 320 may also comprise an ultra low-k material having a dielectric constant less than about 2.0, such as porous SiLK and Teflon microemulsion. The low-k dielectric layer 320 may also be a portion of the dielectric material 307. That is, the dielectric material 307 may comprise a low-k or ultra low-k material that includes a portion (i.e., 320) interposing the MTJ stack 330 and the conductive layer 310.

The MTJ stack 330 may comprise a free layer and a pinned layer on opposing sides of a tunneling barrier layer. The pinned layer may comprise a ferromagnetic material wherein magnetic dipoles and moments are magnetically "pinned," such as by an adjacent or proximate pinning layer comprising an anti-ferromagnetic layer or an anti-ferromagnetic exchange layer. Such a pinned layer may comprise NiFe, NiFeCo, CoFe, Fe, Co, Ni, alloys/compounds thereof and/or other ferromagnetic materials, and the pinning layer may comprise MnFe, IrMnIn, IrMn, CrPtMn, alloys/compounds thereof and/or other antiferromagnetic materials. Antiferromagnetic materials may be those in which substantially complete magnetic moment cancellation has occurred as a result of antiparallel coupling of adjacent atoms or ions, such that an element made from antiferromagnetic materials possesses no net magnetic moment. A free layer may be substantially similar in composition and manufacture to the pinned layer described above. However, such a free layer is not adjacent an antiferromagnetic material and, therefore, may not be pinned. Thus, the magnetic dipoles in the free layer may be aligned in more than one direction. A tunneling barrier layer may comprise $SiO_x$, $SiN_x$, $SiO_xN_y$, $AlO_x$, $TaO_x$, $TiO_x$, $AlN_x$, and/or other non-conductive materials, and may electrically insulate the pinned layer from the free layer. The free layer may interpose the pinned layer and the substrate 305, or the pinned layer may interpose the free layer and the substrate 305.

Figure 4:
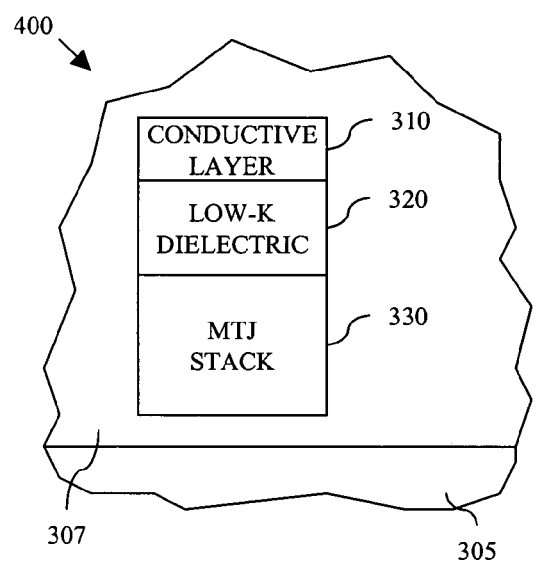
FIG. 4 illustrates a sectional view of another embodiment of an MRAM device constructed according to aspects of the present disclosure.

Referring to FIG. 4, illustrated is a sectional view of another embodiment of the MRAM device 300 shown in FIG. 3, herein designated by the reference numeral 400. The MRAM device 400 includes the substrate 305, conductive layer 310, low-k dielectric layer 320, and MTJ stack 330 shown in FIG. 3. However, the MTJ stack 330 of the MRAM device 400 interposes the low-k dielectric layer 320 and the substrate 305, in contrast to the MRAM device 300 shown in FIG. 3. That is, at least in the orientations shown in FIGS. 3 and 4, the MTJ stack 330 is located over the conductive layer 310 in the MRAM device 300, and the MTJ stack 330 is located under the conductive layer 310 in the MRAM device 400. However, in both embodiments, the low-k dielectric layer 320 interposes the conductive layer 310 and the MTJ stack 330.

Figure 5:
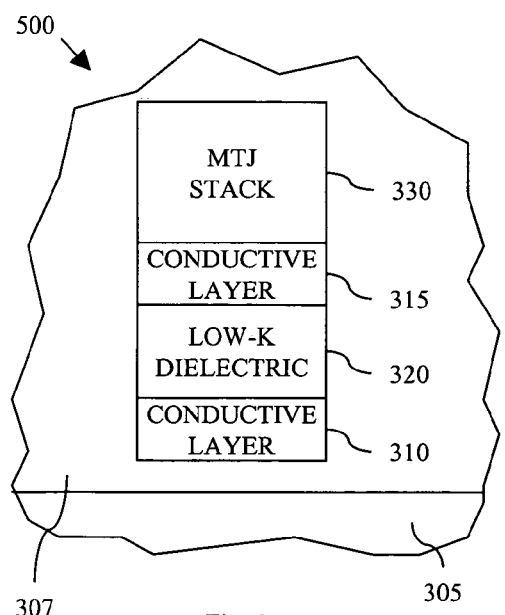
FIG. 5 illustrates a sectional view of another embodiment of an MRAM device constructed according to aspects of the present disclosure.

Referring to FIG. 5, illustrated is a sectional view of another embodiment of the MRAM device 300 shown in FIG. 3, herein designated by the reference numeral 500. The MRAM device 500 includes the substrate 305, conductive layer 310, low-k dielectric layer 320, and MTJ stack 330 shown in FIG. 3. However, the MRAM device 500 also includes an additional conductive layer 315, which may be substantially similar in composition and manufacture to the conductive layer 310. As shown in FIG. 5, the low-k dielectric layer 320 may interpose the conductive layers 310, 315, and the low-k dielectric layer 320 and the conductive layers 310, 315 may collectively interpose the MTJ stack 330 and the substrate 305. The conductive layer 315 may also directly contact the MTJ stack 330, although in some embodiments one or more additional features or layers may interpose the conductive layer 315 and the MTJ stack 330 and/or interpose the conductive layer 315 and the low-k dielectric layer 320. In one embodiment, one of the conductive layers 310, 315 may be or comprise a program line, and the other of the conductive layers 310, 315 may be or comprise a bit line. Of course, each of the conductive layers 310, 315 may also be or comprise a gate line, a digit line, a control line, a word line, and/or other communication paths possibly employed to interconnect the MRAM device 500 with other components.

Figure 6:
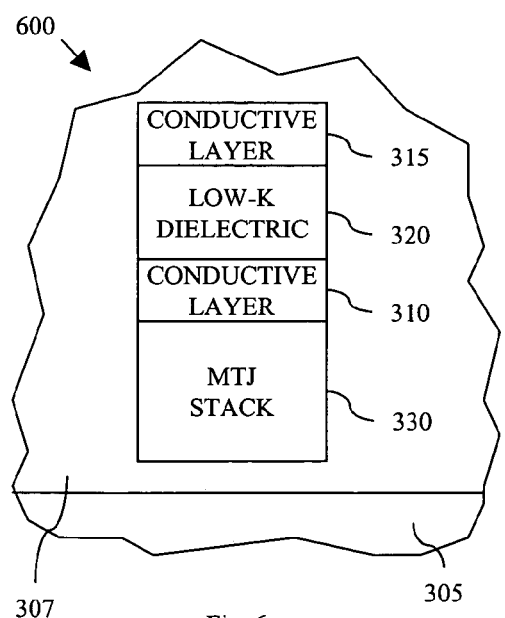
FIG. 6 illustrates a sectional view of another embodiment of an MRAM device constructed according to aspects of the present disclosure.

Referring to FIG. 6, illustrated is a sectional view of another embodiment of the MRAM device 500 shown in FIG. 5, herein designated by the reference numeral 600. The MRAM device 600 includes the substrate 305, conductive layers 310, 315, low-k dielectric layer 320, and MTJ stack 330 shown in FIG. 5. However, the MTJ stack 330 of the MRAM device 600 interposes the substrate 305 and, collectively, the conductive layers 310,315 and the low-k dielectric layer 320. That is, at least as shown in FIG. 6, the MTJ stack 330 is located over the substrate 305, the conductive layer 310 is located over the MTJ stack 330, the IMD layer 320 is located over the conductive layer 310, and the conductive layer 315 is located over the IMD layer 320.

Figure 7:
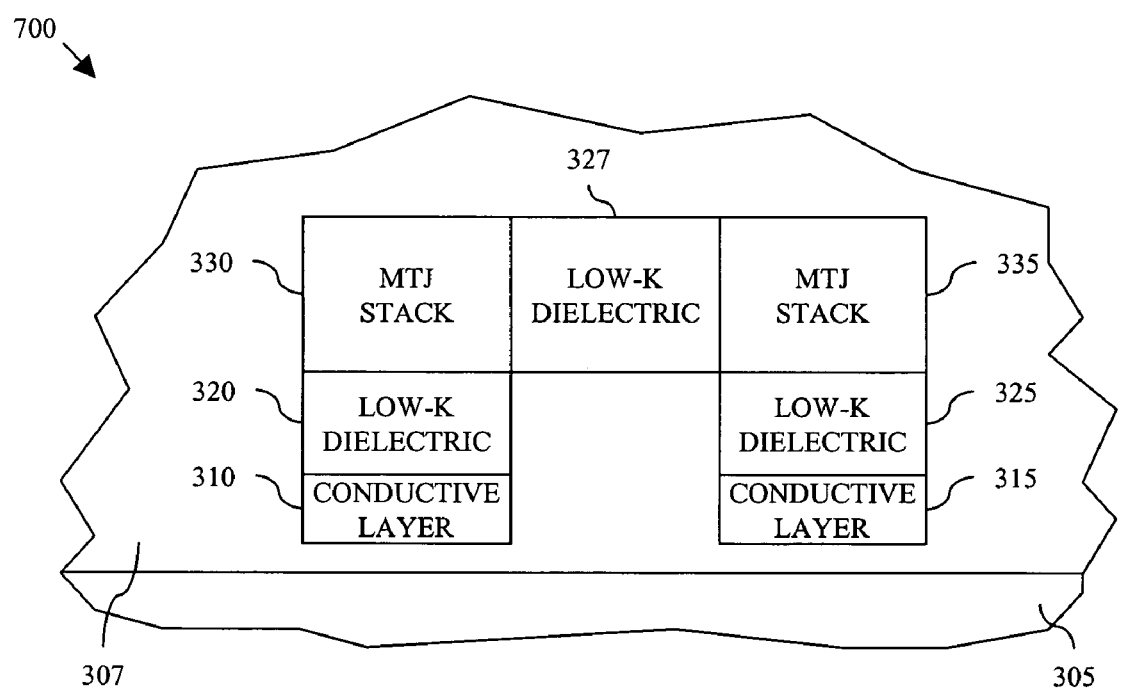
FIG. 7 illustrates a sectional view of another embodiment of an MRAM device constructed according to aspects of the present disclosure.

Referring to FIG. 7, illustrated is a sectional view of another embodiment of the MRAM device 300 shown in FIG. 3, herein designated by the reference numeral 700. The MRAM device 700 includes the substrate 305, conductive layer 310, low-k dielectric layer 320, and MTJ stack 330 shown in FIG. 3. However, the MRAM device 700 also includes an additional conductive layer 315, additional low-k dielectric layers 325, 327, and an additional MTJ stack 335, which may be substantially similar in composition and manufacture to the conductive layer 310, the low-k dielectric layer 320, and the MTJ stack 330, respectively, shown in FIG. 3. As shown in FIG. 5, the low-k dielectric layer 320 may interpose the conductive layer 310 and the MTJ stack 330, and the low-k dielectric layer 325 may interpose the conductive layer 315 and the MTJ stack 335. Moreover, the low-k dielectric layer 327 may interpose the MTJ stacks 330, 335, such that the MTJ stacks 330, 335 laterally oppose the low-k dielectric layer 327 over the substrate 305. Consequently, the low-k dielectric layer 327 may electrically isolate the MTJ stacks 330, 335. In one embodiment, such as shown in FIG. 7, the MTJ stacks 330, 335, and possibly the low-k dielectric layer 327, may be substantially coplanar.

Figure 8:
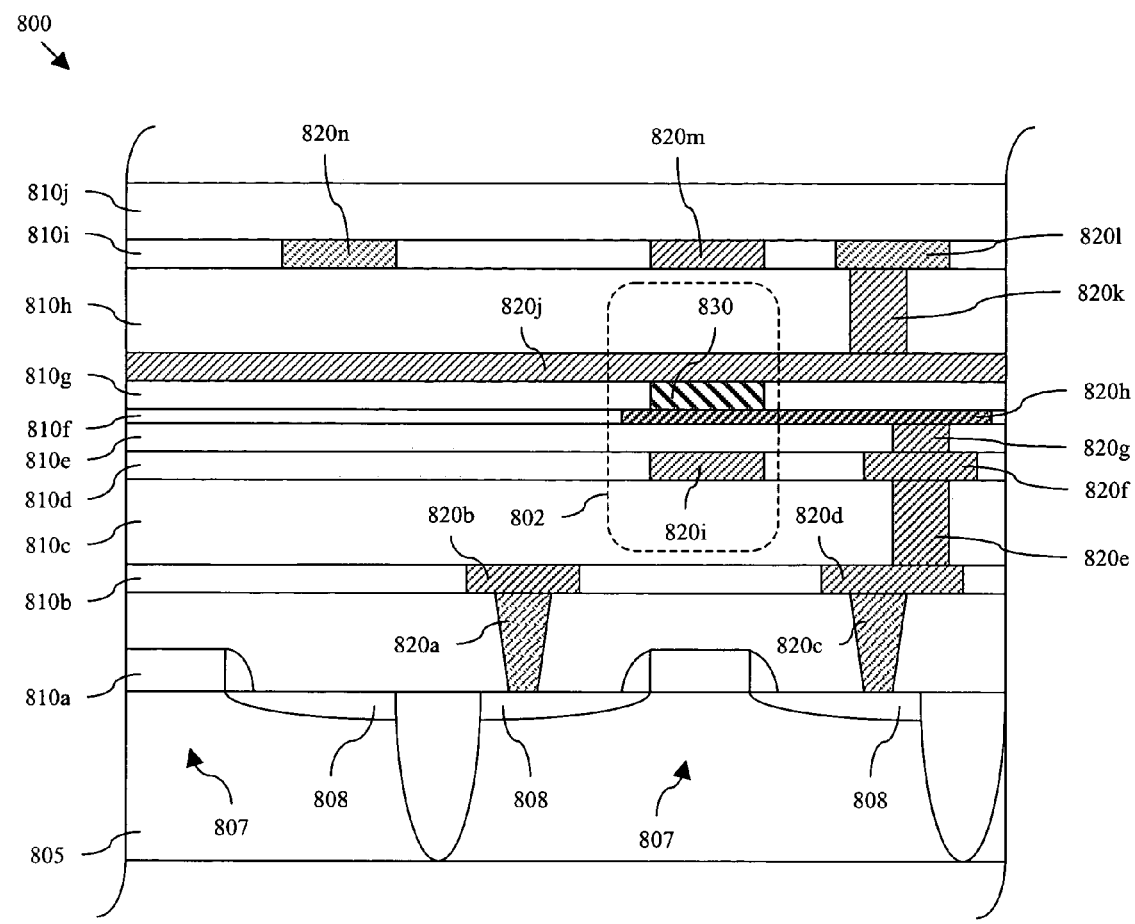
FIG. 8 illustrates a sectional view of one embodiment of an integrated circuit device constructed according to aspects of the present disclosure.

Referring to FIG. 8, illustrated is a sectional view of one embodiment of an integrated circuit device 800 constructed according to aspects of the present disclosure. The integrated circuit device 800 is one embodiment in which one or more of the MRAM devices 300, 400, 500, 600 shown in FIGS. 3–6, respectively, may be implemented. For example, the integrated circuit device 800 may include an MRAM device 802 that is substantially similar to the MRAM devices 300, 400, 500, 600, 700 shown in FIGS. 3–7, respectively.

The integrated circuit device 800 includes a substrate 805 that may be substantially similar in composition and manufacture to the substrate 305 shown in FIG. 3. The substrate 805 may also include a plurality of transistors, memory cells, and/or other microelectronic devices. For example, in the illustrated embodiment, the integrated circuit device 800 includes metal-oxide-semiconductor field-effect-transistor (MOSFET) devices 807 each having source/drain contacts 808 formed at least partially in the substrate 805.

The integrated circuit device 800 also includes a plurality of dielectric layers 810a–810j which may each be substantially similar to the dielectric material 307 shown in FIG. 3. However, at least one of the dielectric layers 810a–810j may be substantially similar to the low-k dielectric layer 320 shown in FIG. 3. For example, in the embodiment shown in FIG. 8, at least one of the dielectric layers 810e, 810f, 810g, and 810h may comprise a low-k dielectric material having a dielectric constant of about 3.9 or less.

The integrated circuit device 800 also includes a plurality of interconnects 820a–820n extending along and/or through one or more of the dielectric layers 810a–810j. The interconnects 820 may comprise copper, tungsten, gold, aluminum, carbon nano-tubes, carbon fullerenes, refractory metals, and/or other materials, and may be formed by CVD, PECVD, ALD, PVD, and/or other processes. One or more of the interconnects 820a–820n may conductively couple ones of the MOSFET devices 807 and/or other devices formed, in, over, and/or on the substrate 805 or otherwise included in the integrated circuit device 800. For example, in the illustrated embodiment, the interconnects 820c–820h collectively interconnect a source/drain contact 808 of one of the MOSFET devices 807 to an MTJ stack 830 of the MRAM device 802, and the interconnect 820j is a bit line possibly interconnecting the MTJ stack 830 to a neighboring MTJ stack or other device outside of the view boundary. The MTJ stack 830 may be substantially similar to the MTJ stack 330 shown in FIG. 3. Consequently, because at least one of the dielectric layers 810e–h may comprise a low-k dielectric material, at least a portion of the dielectric material interposing the MTJ stack 330 and one or more proximate conductive features may comprise a low-k dielectric material.

Thus, the present disclosure provides an MRAM device comprising an MTJ stack located over a substrate, a conductive layer proximate with the MTJ stack and located over the substrate, and a low-k dielectric layer interposing the conductive layer and the MTJ stack. The conductive layer may interpose the substrate and the MTJ stack, or the MTJ stack may interpose the substrate and the conductive layer.

In another embodiment, an MRAM device constructed according to aspects of the present disclosure includes an MTJ stack, first and second conductive layers each contacting the MTJ stack, and a low-k dielectric layer interposing the first and second conductive layers. Such an embodiment may also include a substrate, wherein the first and second conductive layers and low-k dielectric layer may collectively interpose the substrate and the MTJ stack, or the MTJ stack may interpose the substrate and, collectively, the first and second conductive layers and the low-k dielectric layer.

Another embodiment of an MRAM device constructed according to aspects of the present disclosure includes first and second laterally opposing MTJ stacks each located over a substrate. In such an embodiment, a low-k dielectric material electrically isolates the first and second MTJ stacks.

The present disclosure also introduces an integrated circuit including, in one embodiment, a substrate having a transistor located at least partially therein, a first conductive layer located over the substrate, and a first dielectric layer interposing the first conductive layer and the substrate. A magnetic tunneling junction (MTJ) stack is located over the first conductive layer. A second dielectric layer interposes the MTJ stack and the first conductive layer. A third conductive layer is located over the MTJ stack. A third dielectric layer interposes the third conductive layer and the MTJ stack. At least a portion of at least one of the second and third dielectric layers proximate the MTJ stack comprises a low-k dielectric material.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A magnetic random access memory (MRAM) device, comprising:
   a magnetic tunnel junction (MTJ) stack located over a substrate;
   a conductive layer located proximate the MTJ stack and over the substrate; and
   a low-k dielectric layer interposing the conductive layer and the MTJ stack.

2. The MRAM device of claim 1 wherein the conductive layer interposes the substrate and the MTJ stack.

3. The MRAM device of claim 1 wherein the MTJ stack interposes the substrate and the conductive layer.

4. The MRAM device of claim 1 wherein the conductive layer is a program line.

5. The MRAM device of claim 1 wherein the conductive layer is a bit line.

6. The MRAM device of claim 1 wherein the low-k dielectric layer comprises Black Diamond.

7. The MRAM device of claim 1 wherein the low-k dielectric layer has a thickness ranging between about 200 angstroms and about 2000 angstroms.

8. The MRAM device of claim 1 wherein the low-k dielectric layer comprises a material having a dielectric constant of about 3.9 or less.

9. The MRAM device of claim 1 wherein the low-k dielectric layer comprises a material having a dielectric constant of about 2.8 or less.

10. The MRAM device of claim 1 wherein the low-k dielectric layer comprises a material having a dielectric constant of about 2.0 or less.

* * * * *